US010831695B2

(12) United States Patent
Tagashira et al.

(10) Patent No.: US 10,831,695 B2
(45) Date of Patent: Nov. 10, 2020

(54) COMMUNICATION SYSTEM (71) Applicant: KAWASAKI JUKOGYO KABUSHIKI KAISHA, Kobe (JP)

(72) Inventors: Tsuyoshi Tagashira, Kakogawa (JP); Rikuya Uekaji, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 16/488,964

(22) PCT Filed: Feb. 26, 2018

(86) PCT No.: PCT/JP2018/007055
§ 371 (c)(1),
(2) Date: Aug. 27, 2019

(87) PCT Pub. No.: WO2018/155696
PCT Pub. Date: Aug. 30, 2018

(65) Prior Publication Data
US 2020/0004717 A1 Jan. 2, 2020

(30) Foreign Application Priority Data

Feb. 27, 2017 (JP) .................................. 2017-034988

(51) Int. Cl.
G06F 13/42 (2006.01)
H04B 3/56 (2006.01)
H04L 25/02 (2006.01)

(52) U.S. Cl.
CPC .......... *G06F 13/4221* (2013.01); *H04B 3/56* (2013.01); *H04L 25/0272* (2013.01); *G06F 2213/0036* (2013.01)

(58) Field of Classification Search
None
See application file for complete search history.

(56) References Cited

U.S. PATENT DOCUMENTS 7,283,594 B1 * 10/2007 Wood .................. H04L 25/4904
375/278
7,301,836 B1 11/2007 Raghavan et al.
(Continued)

FOREIGN PATENT DOCUMENTS

JP  H01-113979 U  7/1989
JP  H05-8751 U   2/1993
(Continued)

*Primary Examiner* — Henry Tsai
*Assistant Examiner* — Aurangzeb Hassan
(74) *Attorney, Agent, or Firm* — Oliff PLC (57) ABSTRACT

A communication system, first and second device-side connectors and cable-side connectors are configured such that, when the first device-side and first cable-side connector are connected to each other, a communication line connection portion of the first device-side connector and the first cable-side connector are connected to each other, and when the second device-side and second cable-side connector are connected to each other, a communication line connection portion of the second device-side connector and second cable-side connector are connected to each other, and a valid/invalid switching circuit is configured to: in a case where the first and second cable-side connectors are connected to the first and second device-side connectors, respectively, render a connection of a termination resistor to a pair of conductors of an internal communication line invalid; and in other cases, render the connection of the termination resistor to the pair of conductors of the internal communication line valid.

4 Claims, 2 Drawing Sheets (56) References Cited

U.S. PATENT DOCUMENTS

| | | |
|---|---|---|
| 2004/0161966 A1 | 8/2004 | Benson |
| 2008/0240288 A1 | 10/2008 | Kondo |
| 2009/0185215 A1* | 7/2009 | Kreppold ............ G06F 12/0661 |
| | | 358/1.15 |

FOREIGN PATENT DOCUMENTS

| | | |
|---|---|---|
| JP | H09-114565 A | 5/1997 |
| JP | H10-335006 A | 12/1998 |
| JP | 2003-006147 A | 1/2003 |
| JP | 2008-242863 A | 10/2008 |

* cited by examiner

COMMUNICATION SYSTEM

TECHNICAL FIELD

The present invention relates to a communication system, and particularly to a communication system in which a plurality of communication devices are daisy-chain connected.

BACKGROUND ART

Conventionally, there is a known communication system in which a plurality of communication devices are daisy-chain connected. In a case where a plurality of communication devices are daisy-chain connected, the communication device positioned at the termination end of the daisy-chain connection requires that a termination resistor be connected to the termination end of the communication line so that the reflection of transmitted signals will be prevented. However, when looking at one of the communication devices in the daisy-chain connection, in one case, the communication device may be positioned at a middle position in the daisy-chain connection, and in another case, the communication device may be positioned at the termination end of the daisy-chain connection. Therefore, if the communication device includes an internal termination resistor, it is necessary to render the connection of the internal termination resistor valid or invalid in accordance with whether the communication device is positioned at the termination end of the daisy-chain connection or positioned at a middle position in the daisy-chain connection.

As one measure to solve such a problem, there is, for example, a known technique relating to an SCSI (Small Computer System Interface) device. The SCSI device includes an SCSI connector unit including a switch that is turned ON/OFF as a result of attachment/detachment of an external SCSI cable, and in accordance with the switch being turned ON/OFF, a termination resistor circuit IC renders the connection between an internal termination resistor circuit and an SCSI bus ON/OFF (see Patent Literature 1, for example).

There is another known technique in which: an information transmission/reception terminal device is daisy-chain connected to an initiator; an MPU determines, based on a voltage signal outputted from another target, that the other target is further connected to the downstream side of the information transmission/reception terminal device via an SCSI connector; and when no target is connected to the downstream side of the information transmission/reception terminal device, the MPU outputs a control signal to a change-over switch, and connects a bus line connected to the initiator to a terminator, thereby removing, for example, reflected signals that are generated at an SCSI bus (see Abstract and FIG. 1 of Patent Literature 2, for example).

There is yet another known technique relating to a connector that is used on a cable intended for connecting an information device with another information device. The connector includes: a daisy-chain connection portion including a daisy-chain connection mechanism; a terminal resistance circuit for an inter-device connection signal; and a switch circuit that electrically connects/disconnects between the terminal resistance circuit and the connection signal. The switch circuit includes a switch component that electrically disconnects between the terminal resistance circuit and the connection signal as a result of a daisy-chain cable being connected to the daisy-chain connection portion (see Abstract and FIG. 1 of Patent Literature 3, for example).

There is yet another known technique in which a low-level signal "L" is outputted as a connection notification signal from a connector of a termination-side device, and the low-level connection notification signal is transmitted and inputted to a connector of an upstream-side device. Upon receiving the low-level input, the upstream-side device opens the switch of a relay element to bring a termination resistor into an open state. Meanwhile, since the connector of the termination device is rendered disconnected, the switch of a relay element is shorted, and thereby a termination resistor is connected (see Patent Literature 4).

CITATION LIST

Patent Literature

PTL 1: Japanese Laid-Open Patent Application Publication No. H10-335006
PTL 2: Japanese Laid-Open Patent Application Publication No. H09-114565
PTL 3: Japanese Laid-Open Utility Model Application Publication No. H01-113979
PTL 4: Japanese Laid-Open Utility Model Application Publication No. H05-008751

SUMMARY OF INVENTION

Technical Problem

However, in the technique of Patent Literature 1, although the connection between the termination resistor circuit and the SCSI bus is rendered ON/OFF as a result of the attachment/detachment of the external SCSI cable, the SCSI device positioned at a middle position in the daisy-chain connection includes two termination resistors. In addition, although the SCSI device positioned at the termination end of the daisy-chain connection includes only one termination resistor, since the downstream-side SCSI connector unit of the SCSI device is not provided with the termination resistor circuit IC to be connected to the SCSI bus, if the external SCSI cable is attached only to the downstream-side SCSI connector unit, the SCSI device does not function as a SCSI device positioned at the termination end of the daisy-chain connection (see paragraph [0045] and FIG. 4 of Patent Literature 1).

In the technique of Patent Literature 2, in order to detect the presence/absence of a connection with each other, a voltage signal is outputted from a target positioned at the termination end side, and when the information transmission/reception terminal device receives the voltage signal, the terminator and the bus line are rendered disconnected from each other. Accordingly, when only the target is connected to the information transmission/reception terminal device, the terminator and the bus line are rendered disconnected from each other, and the information transmission/reception terminal device does not function as a termination device in the daisy-chain connection.

The technique of Patent Literature 3 requires the installation of two termination resistors.

In the technique of Patent Literature 4, in order to detect the presence/absence of a connection with each other, the notification signal is outputted from the termination device, and when the upstream-side device does not receive the notification signal, the termination resistor is rendered disconnected. Accordingly, when only the termination device is connected to the upstream-side device, the termination resistor is rendered disconnected, and the upstream-side device does not function as a termination device in the daisy-chain connection.

The present invention has been made to solve the above-described problems. An object of the present invention is to provide a communication system in which a communication device includes one termination resistor for one communication line, and when a communication cable is attached to only one of a pair of upstream-side and downstream-side connectors of the communication device in daisy-chain connection, regardless of whether it is attached to the upstream-side connector or the downstream-side connector, the communication device functions as a termination communication device in the daisy-chain connection, with the termination resistor connected to the communication line.

Solution to Problem

In order to solve the above-described problems, a communication system according to one aspect of the present invention includes: a plurality of communication devices; and one or more communication cables. Each of the communication devices includes: an internal communication line configured to transmit signals by a pair of conductors; a communicator connected to the internal communication line; a termination resistor connected between the pair of conductors of the internal communication line; a valid/invalid switching circuit configured to render the connection of the termination resistor to the pair of conductors of the internal communication line valid or invalid; a first device-side connector including a communication line connection portion connected to one end of the internal communication line; and a second device-side connector including a communication line connection portion connected to another end of the internal communication line. Each of the communication cables includes: an external communication line configured to transmit signals by a pair of conductors; a first cable-side connector including a communication line connection portion connected to one end of the external communication line; and a second cable-side connector including a communication line connection portion connected to another end of the external communication line. The first and second device-side connectors and the first and second cable-side connectors are configured such that: when the first device-side connector and the first cable-side connector are connected to each other, the communication line connection portion of the first device-side connector and the communication line connection portion of the first cable-side connector are connected to each other; and when the second device-side connector and the second cable-side connector are connected to each other, the communication line connection portion of the second device-side connector and the communication line connection portion of the second cable-side connector are connected to each other. The valid/invalid switching circuit is configured to: in a case where the first and second cable-side connectors are connected to the first and second device-side connectors, respectively, render the connection of the termination resistor to the pair of conductors of the internal communication line invalid; and in other cases, render the connection of the termination resistor to the pair of conductors of the internal communication line valid.

According to the above configuration, when the first cable-side connector of one of the communication cables is connected to the first device-side connector of one of the communication devices, the communication line connection portion of the first device-side connector and the communication line connection portion of the first cable-side connector are connected to each other, and thereby the one communication device is daisy-chain connected as a termination communication device. In this state, in the communication device, the connection of the termination resistor to the pair of conductors of the internal communication line is valid. Accordingly, the communication device properly functions as a termination communication device in the daisy-chain connection. In addition, when the second cable-side connector of another communication cable is connected to the second device-side connector of the communication device, the communication line connection portion of the second device-side connector and the communication line connection portion of the second cable-side connector are connected to each other, and thereby the communication device is daisy-chain connected as a middle communication device in the daisy-chain connection. In this state, in the communication device, the connection of the termination resistor to the pair of conductors of the internal communication line is invalid. Accordingly, the communication device properly functions as a middle communication device in the daisy-chain connection. When the first or second cable-side connector of a communication cable is connected to only one of the first and second device-side connectors of the communication device, the connection of the termination resistor to the pair of conductors of the internal communication line is valid. Accordingly, when the communication cable is connected to only one of the first and second device-side connectors, regardless of whether it is connected to the first device-side connector or the second device-side connector, the communication device properly functions as a termination communication device in the daisy-chain connection. In addition, the number of termination resistors that the communication device is required to include is just one. Thus, the above configuration makes it possible to provide a communication system in which a communication device includes one termination resistor for one communication line, and when a communication cable is attached to only one of a pair of upstream-side and downstream-side connectors of the communication device in daisy-chain connection, regardless of whether it is attached to the upstream-side connector or the downstream-side connector, the communication device functions as a termination communication device in the daisy-chain connection, with the termination resistor connected to the communication line.

The valid/invalid switching circuit may be configured to render the connection of the termination resistor to the pair of conductors of the internal communication line valid or invalid in accordance with a first control signal or a second control signal inputted to the valid/invalid switching circuit. Each of the communication devices may further include a control circuit that includes a first electrical contact point and a second electrical contact point, the control circuit being configured to: generate the first control signal when at least one of the first electrical contact point and the second electrical contact point is opened; generate the second control signal when both the first electrical contact point and the second electrical contact point are closed; and input the generated first control signal or second control signal to the valid/invalid switching circuit. The first device-side connector may further include one contact member of the first electrical contact point of the control circuit. The first cable-side connector may further include another contact member of the first electrical contact point of the control circuit. The second device-side connector may further include one contact member of the second electrical contact point of the control circuit. The second cable-side connector may further include another contact member of the second electrical contact point of the control circuit. The first and second device-side connectors and the first and second cable-side connectors may be configured such that: when the first device-side connector and the first cable-side connector are connected to each other, the communication line connection portion of the first device-side connector and the communication line connection portion of the first cable-side connector are connected to each other, and the one contact member of the first electrical contact point of the first device-side connector and the other contact member of the first electrical contact point of the first cable-side connector come into contact with each other; and when the second device-side connector and the second cable-side connector are connected to each other, the communication line connection portion of the second device-side connector and the communication line connection portion of the second cable-side connector are connected to each other, and the one contact member of the second electrical contact point of the second device-side connector and the other contact member of the second electrical contact point of the second cable-side connector come into contact with each other.

According to the above configuration, when the first cable-side connector of one of the communication cables is connected to the first device-side connector of one of the communication devices, the communication line connection portion of the first device-side connector and the communication line connection portion of the first cable-side connector are connected to each other, and thereby the one communication device is daisy-chain connected as a termination communication device. In addition, since the one contact member of the first electrical contact point of the first device-side connector and the other contact member of the first electrical contact point of the first cable-side connector come into contact with each other, the first electrical contact point is closed. However, since the second electrical contact point remains open, the control circuit inputs the first control signal to the valid/invalid switching circuit, and the valid/invalid switching circuit renders the connection of the termination resistor to the pair of conductors of the internal communication line valid. Accordingly, the communication device properly functions as a termination communication device in the daisy-chain connection.

In this state, when the second cable-side connector of another communication cable is connected to the second device-side connector of the communication device, the communication line connection portion of the second device-side connector and the communication line connection portion of the second cable-side connector are connected, and thereby the communication device is daisy-chain connected as a middle communication device in the daisy-chain connection. In addition, since the one contact member of the second electrical contact point of the second device-side connector and the other contact member of the second electrical contact point of the second cable-side connector come into contact with each other, the second electrical contact point is closed. In this manner, both the first electrical contact point and the second electrical contact point are closed. Accordingly, the control circuit inputs the second control signal to the valid/invalid switching circuit, and the valid/invalid switching circuit renders the connection of the termination resistor to the pair of conductors of the internal communication line invalid. Therefore, the communication device properly functions as a middle communication device in the daisy-chain connection. Moreover, the function of the valid/invalid switching circuit can be realized with a simple configuration together with the control circuit.

The valid/invalid switching circuit may include a switching element configured to: become a conductive state when an ON voltage is applied to a control terminal of the switching element; and become a non-conductive state when the ON voltage is not applied to the control terminal of the switching element. The termination resistor may be connected to the pair of conductors via the switching element. The control circuit may further include: a voltage applying element configured to apply the ON voltage to the switching element; and an electrical short-circuit path configured to short-circuit both ends of the voltage applying element. The first electrical contact point and the second electrical contact point may be inserted in series in the electrical short-circuit path. The first cable-side connector may include: a first portion of the electrical short-circuit path; and a pair of contactors constituting both ends of the first portion, respectively, the pair of contactors constituting the other contact member of the first electrical contact point. The first device-side connector may include a pair of contactors constituting a pair of ends, respectively, corresponding to both the ends of the first portion of the electrical short-circuit path, the pair of contactors constituting the one contact member of the first electrical contact point. The second cable-side connector may include: a second portion of the electrical short-circuit path; and a pair of contactors constituting both ends of the second portion, respectively, the pair of contactors constituting the other contact member of the second electrical contact point. The second device-side connector may include a pair of contactors constituting a pair of ends, respectively, corresponding to both the ends of the second portion of the electrical short-circuit path, the pair of contactors constituting the one contact member of the second electrical contact point. When the first electrical contact point is closed as a result of the one contact member and the other contact member coming into contact with each other and the second electrical contact point is closed as a result of the one contact member and the other contact member coming into contact with each other, the electrical short-circuit path may become a conductive state.

According to the above configuration, when the first cable-side connector is connected to the first device-side connector, the pair of contactors of the first cable-side connector and the pair of contactors of the first device-side connector come into contact with each other, and thereby the one contact member and the other contact member of the first electrical contact point come into contact with each other. As a result, the first electrical contact point of the electrical short-circuit path is closed. Meanwhile, when the second cable-side connector is connected to the second device-side connector, the pair of contactors of the second cable-side connector and the pair of contactors of the second device-side connector come into contact with each other, and thereby the one contact member and the other contact member of the second electrical contact point come into contact with each other. As a result, the second electrical contact point of the electrical short-circuit path is closed.

Accordingly, in a case where the first cable-side connector is unconnected to the first device-side connector, or in a case where the second cable-side connector is unconnected to the second device-side connector, since one of the two electrical contact points of the electrical short-circuit path is not closed, both the ends of the voltage applying element are not short-circuited, and the voltage applying element applies the ON voltage to the control terminal of the switching element, thereby causing the switching element to become a conductive state. In this manner, the termination resistor is connected to the pair of conductors of the internal communication line.

On the other hand, when the first cable-side connector is connected to the first device-side connector and the second cable-side connector is connected to the second device-side connector, both the two electrical contact points of the electrical short-circuit path are closed, and thereby both the ends of the voltage applying element are short-circuited. Accordingly, the voltage applying element does not apply the ON voltage to the control terminal of the switching element. As a result, the switching element becomes a non-conductive state. In this manner, the termination resistor is rendered unconnected to the pair of conductors of the internal communication line.

Thus, necessary functions of the valid/invalid switching circuit and the control circuit can be realized by using simple electronic circuits.

In each communication device, a structure of the first device-side connector and a structure of the second device-side connector may be the same, and in each communication cable, a structure of the first cable-side connector and a structure of the second cable-side connector may be the same.

According to the above configuration, either one of the two connectors of one communication cable may be connected to either one of the two connectors of one communication device in any combination, and whatever the combination is, the one communication device can be properly daisy-chain connected in the same manner. Thus, the above configuration makes it possible to readily perform the daisy-chain connection.

Advantageous Effects of Invention

The present invention makes it possible to provide a communication system in which a communication device includes one termination resistor for one communication line, and when a communication cable is attached to only one of a pair of upstream-side and downstream-side connectors of the communication device in daisy-chain connection, regardless of whether it is attached to the upstream-side connector or the downstream-side connector, the communication device functions as a termination communication device in the daisy-chain connection, with the termination resistor connected to the communication line.

DESCRIPTION OF EMBODIMENTS

Hereinafter, an embodiment of the present invention is described with reference to the drawings. In the drawings, the same or corresponding elements are denoted by the same reference signs, and repeating the same descriptions is avoided below.

Embodiment

[Configuration]

Figure 1:
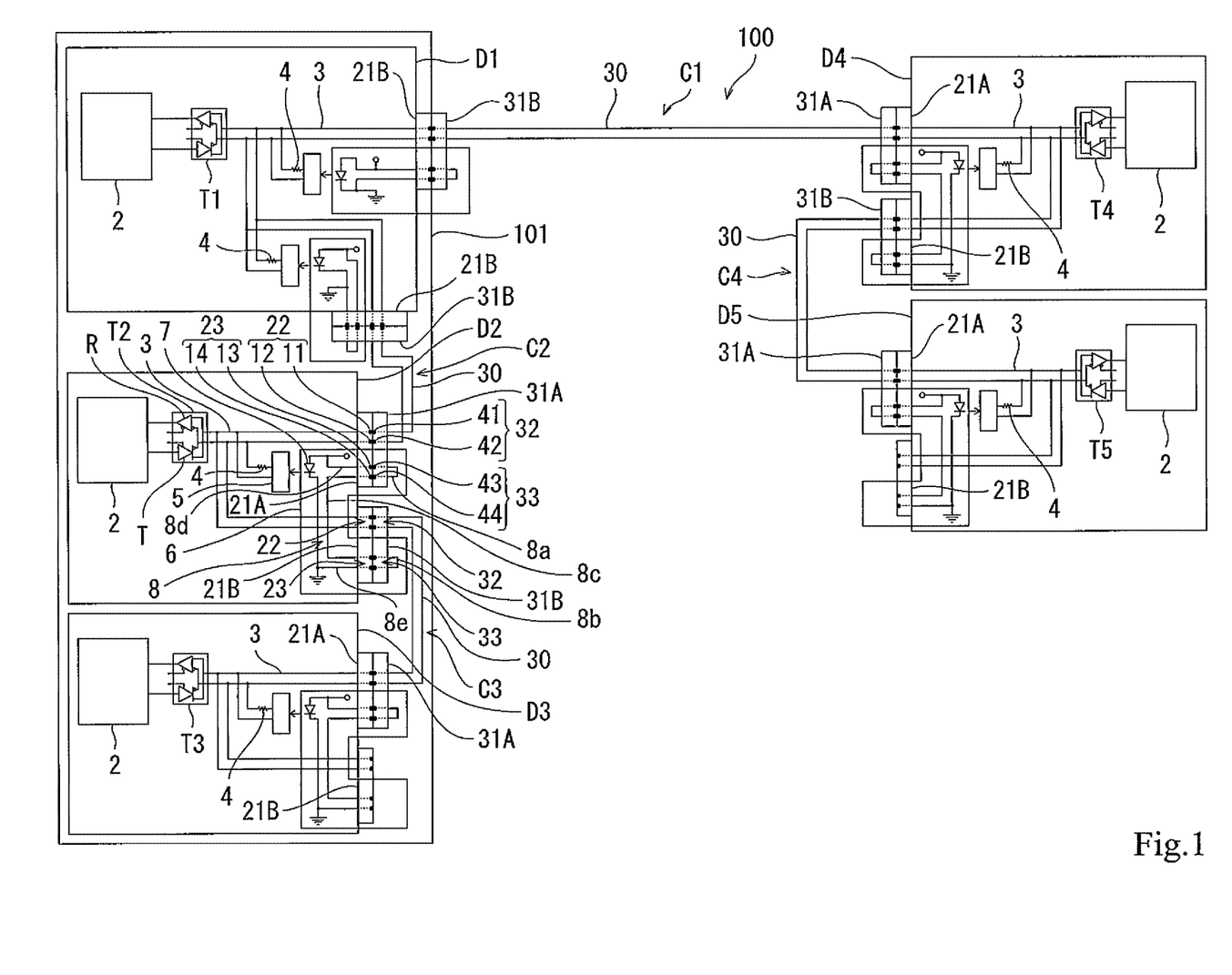
FIG. 1 is a circuit diagram showing the configuration of a communication system according to an embodiment of the present invention.
Figure 2:
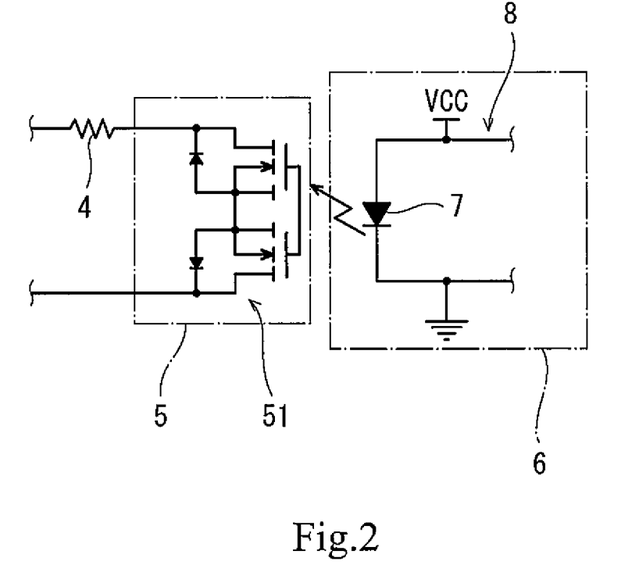
FIG. 2 is a circuit diagram showing a specific configuration example of a valid/invalid switching circuit and a control circuit of FIG. 1.

FIG. 1 is a circuit diagram showing the configuration of a communication system according to the embodiment of the present invention. FIG. 2 is a circuit diagram showing a specific configuration example of a valid/invalid switching circuit and a control circuit of FIG. 1.

With reference to FIG. 1, a communication system 100 according to the embodiment includes a plurality of (in this example, five) communication devices D1 to D5 and one or more (in this example, four) communication cables C1 to C4. The communication devices D1 to D5 are daisy-chain connected by the communication cables C1 to C4, with the communication device D1 positioned at the center of the daisy-chain connection. The communication devices D2 and D4 are middle communication devices in the daisy-chain connection, and the communication devices D3 and D5 are termination communication devices in the daisy-chain connection.

Each of the communication devices D1 to D5 may be any device capable of performing communications. In the present embodiment, the communication system 100 is constructed, for example, within a robot controller. However, the communication system 100 is not thus limited. The communication devices D1 to D3 are accommodated in a casing 101, and constitute standard equipment of the robot controller. The communication devices D4 and D5 are arranged outside the casing 101, and constitute extended equipment of the robot controller.

Each of the communication devices D1 to D5 includes an internal communication line 3, and each of the communication cables C1 to C4 includes an external communication line 30. The internal communication lines 3 of the communication devices D1 to D5 and the external communication lines 30 of the communication cables C1 to C4 are daisy-chain connected by connecting device-side connectors 21A and 21B with cable-side connectors 31A and 31B, thereby forming a single communication line. Each of the communication devices D1 to D5 may include a plurality of internal communication lines 3 and each of the communication cables C1 to C4 may include a plurality of external communication lines 30 so as to form a plurality of communication lines. In this case, each of the communication devices D1 to D5 and each of the communication cables C1 to C4 are required to include components described in the present embodiment for each of the plurality of communication lines.

<Configuration of Communication Cable>

Each of the communication cables C1 to C4 has the same configuration except their length. Each of the communication cables C1 to C4 includes the external communication line 30 and a pair of cable-side connectors 31A and 31B. The external communication line 30 is configured to transmit signals by a pair of conductors. Each of the communication cables C1 to C4 is constituted by, for example, a coaxial cable, a stranded wire, or a feeder wire.

Each of the pair of cable-side connectors 31A and 31B has the same configuration in this example. However, as an alternative, the cable-side connectors 31A and 31B may have different configurations from each other. For the sake of convenience of the description, in each of the communication cables C1 to C4, a connector connected to a first device-side connector 21A of one of the communication devices D1 to D5 is defined as a first cable-side connector 31A, and a connector connected to a second device-side connector 21B of another one of the communication devices D1 to D5 is defined as a second cable-side connector 31B. The first cable-side connector 31A and the second cable-side connector 31B are described below.

Hereinafter, a description is given by taking, as one example, the first cable-side connector 31A of the communication cable C2 and the second cable-side connector 31B of the communication cable C3. The first cable-side connector 31A of the communication cable C2 includes: a pair of contactors 41 and 42 intended for the external communication line 30; a pair of contactors 43 and 44 intended for a control circuit 6; and a first portion 8a of an electrical short-circuit path 8 of the control circuit 6. The pair of contactors 41 and 42 is connected to the pair of conductors of the external communication line 30, respectively. The pair of contactors 41 and 42 constitutes a contact member 32 intended for the external communication line 30. The pair of contactors 43 and 44 constitutes both ends, respectively, of the first portion 8a of the electrical short-circuit path 8 of the control circuit 6. The pair of contactors 43 and 44 constitutes the other contact member 33 of a first electrical contact point (23, 33), which will be described below.

Similar to the first cable-side connector 31A of the communication cable C2, the second cable-side connector 31B of the communication cable C3 includes the contact member 32 intended for the external communication line 30 and the contact member 33 intended for the control circuit 6. However, the second cable-side connector 31B of the communication cable C3 includes a second portion 8b of the electrical short-circuit path 8 of the control circuit 6 instead of the first portion 8a of the electrical short-circuit path 8 of the control circuit 6 of the first cable-side connector 31A of the communication cable C2. In accordance therewith, the pair of contactors (the reference signs thereof are omitted in FIG. 1) of the contact member 33 constitutes both ends, respectively, of the second portion 8b of the electrical short-circuit path 8 of the control circuit 6. The pair of contactors constitutes the other contact member 33 of a second electrical contact point (23, 33), which will be described below.

As described above, fundamentally, the first cable-side connector 31A and the second cable-side connector 31B have the same structure. Therefore, in order to simplify and facilitate the understanding of the drawing, the reference signs of the contactors of the second cable-side connector 31B are omitted in FIG. 1. In addition, the reference signs of contactors are further omitted not only for the communication cable C2, but also for the communication cables C1, C3, and C4.

<Configuration of Communication Device>

Among the communication devices D1 to D5, the communication device D1 is a main communication device, and the communication devices D2 to D5 are auxiliary communication devices. The main communication device and the auxiliary communication devices may be defined in any way. Typically, the main communication device is a master communication device, and the auxiliary communication devices are slave communication devices. Alternatively, the main communication device is a host communication device, and the auxiliary communication devices are guest communication devices. Further alternatively, the main communication device is a server communication device, and the auxiliary communication devices are terminal communication devices.

In the description herein, the auxiliary communication devices D2 to D5 share a common configuration, and the main communication device D1 has an exceptional configuration different from that of the auxiliary communication devices D2 to D5. Each of the auxiliary communication devices D2 to D5 has a characteristic configuration according to the embodiment of the present invention. Hereinafter, the configuration common to the auxiliary communication devices D2 to D5 is described by taking the configuration of the communication device D2 as one example, and the exceptional configuration of the communication device D1 is described as necessary. That is, for the communication devices D1 and D3 to D5, the description of their configurational features that are shared by the communication device D2 is omitted.

The communication device D2 includes a data processor 2, the internal communication line 3, communicators T1 to T5, a termination resistor 4, a valid/invalid switching circuit 5, the control circuit 6, the first device-side connector 21A, and the second device-side connector 21B. Hereinafter, for the sake of convenience of the description, a connector of the communication device D2, the connector being connected to the communication device that is positioned upstream of the communication device D2 in the daisy-chain connection, is defined as the first device-side connector 21A. Also, a connector of the communication device D2, the connector being connected to the communication device that is positioned downstream of the communication device D2 in the daisy-chain connection, is defined as the second device-side connector 21B. Since the communication device D1 is the most upstream communication device, both of the two connectors thereof are second device-side connectors 21B.

The first cable-side connector 31A of the communication cable C2 is connected to the first device-side connector 21A of the communication device D2, and the second cable-side connector 31B of the communication cable C3 is connected to the second device-side connector 21B of the communication device D2.

The internal communication line 3 is configured to transmit signals by a pair of conductors. The internal communication line 3 is constituted by, for example, a coaxial cable, a stranded wire, or a feeder wire.

The communicator T2 is connected to the internal communication line 3, and includes a receiver R configured to receive data and a transmitter T configured to transmit data.

The data processor 2 processes the data transmitted/received by the communicator T2. The data processor 2 is configured as a processor such as a microcontroller, an FPGA (Field-Programmable Gate Array), or a PLC (Programmable Logic Controller), or configured as an arithmetic operation device such as a logic circuit.

The termination resistor 4 is connected between the pair of conductors of the internal communication line 3 via the valid/invalid switching circuit 5. The valid/invalid switching circuit 5 renders the connection of the termination resistor 4 to the pair of conductors of the internal communication line 3 valid or invalid. The valid/invalid switching circuit 5 is configured to render the connection of the termination resistor 4 to the pair of conductors of the internal communication line 3 valid or invalid in accordance with a first control signal or a second control signal inputted to the valid/invalid switching circuit 5. The control circuit 6 includes a pair of electrical contact points (23, 33) and (23, 33). The control circuit 6 is configured to: generate the first control signal when at least one of these electrical contact points is opened; generate the second control signal when both the electrical contact points are closed; and input the generated first control signal or second control signal to the valid/invalid switching circuit 5. The pair of electrical contact points (23, 33) and (23, 33) will be described in detail below.

Each of the first device-side connector 21A and the second device-side connector 21B includes a pair of contactors 11 and 12 intended for the internal communication line 3 and a pair of contactors 13 and 14 intended for the control circuit 6.

In each of the first device-side connector 21A and the second device-side connector 21B, the pair of contactors 11 and 12 is connected to the pair of conductors of the internal communication line 3, respectively. The pair of contactors 11 and 12 constitutes a contact member 22 intended for the internal communication line 3. Each of the pair of contactors 13 and 14 is connected to a part of the electrical short-circuit path 8 of the control circuit 6. The pair of contactors 13 and 14 constitutes one contact member 23 of the first or second electrical contact point (23, 33), which will be described below. Since the first device-side connector 21A and the second device-side connector 21B have the same structure, the reference signs of the contactors of the second device-side connector 21B are omitted in FIG. 1.

With reference to FIG. 1 and FIG. 2, the valid/invalid switching circuit 5 includes a switching element 51. The switching element 51 becomes a conductive state when an ON voltage is applied to a control terminal thereof, and becomes a non-conductive state when the ON voltage is not applied to the control terminal. The switching element 51 is constituted by, for example, a pair of photo MOSFETs. The pair of photo MOSFETs is configured such that the sources of the two photo MOSFETs are connected to each other, and the drains of the two photo MOSFETs are connected to both ends, respectively, of an electrical path that connects the termination resistor 4 to the internal communication line 3. The pair of photo MOSFETs includes a pair of diodes that are parasitic diodes of the respective photo MOSFETs. The switching element 51 is required to turn on/off (pass/block) an alternating current (AC signal) flowing through the termination resistor 4. It should be noted that, in the case of using only one photo MOSFET, the parasitic diode becomes a conductive state when a reverse bias is applied, and thus the alternating current cannot be turned off. However, in this example, the pair of photo MOSFETs configured as above is used as the switching element 51. Therefore, the alternating current flowing through the termination resistor 4 can be turned on/off.

The reason for using the photo MOSFETs is to form a photocoupler for the purpose of electrically isolating the communication line 3 from the control circuit 6. Alternatively, ordinary MOSFETs, bipolar transistors, etc., may be used as the switching element 51.

The control circuit 6 includes: a voltage applying element 7 configured to apply an ON voltage to the switching element 51; and the electrical short-circuit path 8 configured to short-circuit both ends of the voltage applying element 7. Specifically, in the control circuit 6, the voltage applying element 7 and the electrical short-circuit path 8 are connected in parallel between a positive voltage source VCC and the ground. The voltage applying element 7 is constituted by, for example, a photodiode (infrared-emitting diode). A set of the photodiode and the above-described pair of photo MOSFETs form a photocoupler. Accordingly, when the electrical short-circuit path 8 is opened, an electric current flows through the voltage applying element 7, which is a photodiode, and light (infrared light) is emitted therefrom. Upon receiving the light, an ON voltage is generated at (i.e., the ON voltage is applied to) the gates (control terminals) of the pair of photo MOSFETs, and thereby the pair of photo MOSFETs is turned on (becomes a conductive state). On the other hand, when the electrical short-circuit path 8 is closed, the electric current stops flowing through the voltage applying element 7, which is a photodiode. As a result, the light (infrared light) disappears. Accordingly, the ON voltage stops being generated at the gates of the pair of photo MOSFETs, and thereby the pair of photo MOSFETs is turned off (becomes a non-conductive state). The presence and absence of the aforementioned light emitted from the photodiode serve as the aforementioned first and second control signals.

The voltage applying element may be any element capable of generating voltage. An ordinary diode, a resistance element, a transistor to which a diode is connected, and so forth may be usable as a voltage applying element.

With reference to FIG. 1, the electrical short-circuit path 8 is configured as a current path that has one end connected to a positive electrode terminal of the voltage applying element 7 and the other end connected to a negative electrode terminal of the voltage applying element 7.

The electrical short-circuit path 8 includes: a first portion 8a, which is an arbitrary portion; a second portion 8b away from the first portion 8a; a third portion 8c, which is a portion between the first portion 8a and the second portion 8b; a portion 8d between the aforementioned one end and the first portion 8a; and a portion 8e between the aforementioned other end and the second portion 8a. Each of the portions 8a to 8e of the electrical short-circuit path has an end positioned toward the positive electrode terminal of the voltage applying element 7 and an end positioned toward the negative electrode terminal of the voltage applying element 7. Hereinafter, for each of the portions 8a to 8e, the end positioned toward the positive electrode terminal of the voltage applying element 7 is referred to as "positive end", and the end positioned toward the negative electrode terminal of the voltage applying element 7 is referred to as "negative end".

The negative end of the portion 8d between the one end of the electrical short-circuit path 8 and the first portion 8a is constituted by the contactor 13 of the first device-side connector 21A. The first portion 8a is disposed inside the first cable-side connector 31A of the communication cable C2. The positive end and the negative end of the first portion 8a are constituted by the contactor 43 and the contactor 44, respectively. The positive end and the negative end of the third portion 8c are constituted by the contactor 14 of the first device-side connector 21A and the positive-side contactor 13 (the reference sign 13 is omitted in FIG. 1) of the contact member 23 of the second device-side connector 21B, respectively. The second portion 8b is disposed inside the second cable-side connector 31B of the communication cable C3. The positive end and the negative end of the second portion 8b are constituted by the pair of contactors 43 and 44 (the reference signs 43 and 44 are omitted in FIG. 1) of the contact member 33, respectively. The positive end of the portion 8e between the other end of the electrical short-circuit path 8 and the second portion 8b is constituted by the negative-side contactor 14 (the reference sign 14 is omitted in FIG. 1) of the contact member 23 of the second device-side connector 21B.

It should be noted that the first device-side connector 21A and the second device-side connector 21B have the same configuration. Accordingly, in order to simplify and facilitate the understanding of the drawing, in FIG. 1, the reference signs of the pairs of contactors of the second device-side connector 21B of the communication device D2, and the reference signs of the pairs of contactors of each of the first device-side connector 21A and the second device-side connector 21B of the communication devices D1 and D3 to D5, are omitted in FIG. 1. Also, for the sake of simplifying and facilitating the understanding of FIG. 1, some of the reference signs of the components of the communication devices D1 and D3 to D5 are omitted as necessary in FIG. 1.

Returning to FIG. 1, the contact member 23 of the first device-side connector 21A and the contact member 33 of the first cable-side connector 31A of the communication cable C2 constitute the first electrical contact point of the electrical short-circuit path 8, and the contact member 23 of the second device-side connector 21B and the contact member 33 of the second cable-side connector 31B of the communication cable C3 constitute the second electrical contact point of the electrical short-circuit path 8.

As one example, the contactors 11 to 14 of the connectors 21A and 21B of the communication device D2, and the contactors 31 to 34 of the connectors 31A and 31B of the communication cables C2 and C3, are formed in such shapes that they fit with each other. For example, the contactors on one side are formed as pins, and the contactors on the other side are formed as sockets. In this case, the connectors on the one side are fitted in the connectors on the other side by insertion, and thereby the connectors 31A and 31B of the communication cables C2 and C3 are attached to the connectors 21A and 21B of the communication device D2. As another example, the contactors 11 to 14 of the connectors 21A and 21B of the communication device D2, and the contactors 31 to 34 of the connectors 31A and 31B of the communication cables C2 and C3, may be formed in such shapes that they are abutted against one another. In this case, the connectors 31A and 31B of the communication cables C2 and C3 may be attached to the connectors 21A and 21B of the communication device D2 by magnets or fasteners, for example.

<Configuration of Communication Device D1>

With reference to FIG. 1, the communication device D1 includes a pair of termination resistors 4, a pair of valid/invalid switching circuits 5, and a pair of control circuits 6. Each of the termination resistors 4, each of the valid/invalid switching circuits 5, and each of the control circuits 6 of the communication device D1 are the same as those of the communication device D2. The communication device D1 further includes a pair of connectors 21B, which is connected to the pair of control circuits 6, respectively. Except these, the configuration of the communication device D1 is the same as that of the communication device D2.

[Operations]

Next, operations of the communication system 100 configured as above are described with reference to FIG. 1 and FIG. 2.

Hereinafter, operations of the communication system 100 are described by taking the communication devices D1 to D3 and the communication cables C2 and C3 as one example. First, a description is given of a case in which, in a state where the second cable-side connector 31B of the communication cable C2 is attached to the second device-side connector 21B of the communication device D1, the first cable-side connector 31A of the communication cable C2 is attached to the first device-side connector 21A of the communication device D2. In this case, the second cable-side connector 31B of the communication cable C3 is not attached to the second device-side connector 21B of the communication device D2.

In this state, in the communication device D2, the first and second electrical contact points of the electrical short-circuit path 8 are open. Accordingly, in the control circuit 6, an electric current flows through the photodiode serving as the voltage applying element 7, and light is emitted therefrom. Thus, the pair of photo MOSFETs serving as the switching element 51 of the valid/invalid switching circuit 5 is ON. In this manner, the connection of the termination resistor 4 between the pair of conductors of the internal communication line 3 is kept valid.

Meanwhile, in the communication device D1, the electrical contact point of the electrical short-circuit path over the second device-side connector 21B and the second cable-side connector 31B of the communication cable is closed. Accordingly, in the control circuit, both ends of the photodiode serving as the voltage applying element are short-circuited, such that no electric current flows through the photodiode, and no light is emitted therefrom. Thus, the pair of photo MOSFETs serving as the switching element 51 of the valid/invalid switching circuit 5 is OFF, and the connection of the termination resistor 4 between the pair of conductors of the internal communication line 3 is rendered invalid.

In this state, when the first cable-side connector 31A of the communication cable C2 is connected to the first device-side connector 21A of the communication device D2, the contact member 22 of the first device-side connector 21A, which is a contact member intended for the internal communication line, and the contact member 32 of the first cable-side connector 31A, which is a contact member intended for the external communication line, are connected to each other. In this manner, the internal communication line 3 of the communication device D2 is connected to the internal communication line 3 of the communication device D1 via the external communication line 30 of the communication cable C2.

Also, the one contact member 23 of the first electrical contact point of the first device-side connector 21A and the other contact member 33 of the first electrical contact point of the first cable-side connector 31A are connected to each other. As a result, the first electrical contact point of the electrical short-circuit path 8 is closed. However, since the second cable-side connector 31B of the communication cable C3 is not attached to the second device-side connector 21B, the second electrical contact point of the electrical short-circuit path 8 is open. Accordingly, in the control circuit 6, the photodiode serving as the voltage applying element 7 emits light, and thus the pair of photo MOSFETs serving as the switching element 51 of the valid/invalid switching circuit 5 is ON. In this manner, the connection of the termination resistor 4 between the pair of conductors of the internal communication line 3 is kept valid.

Therefore, the communication device D2 functions as a termination communication device in the daisy-chain connection.

Next, in this state, the second cable-side connector 31B of the communication cable C3 is connected to the second device-side connector 21B of the communication device D2, and the first cable-side connector 31A of the communication cable C3 is connected to the first device-side connector 21A of the communication device D3. In this case, in the communication device D3, similar to the above-described case where the first cable-side connector 31A of the communication cable C2 is connected to the first device-side connector 21A of the communication device D2, the internal communication line 3 of the communication device D3 is connected to the external communication line 30 of the communication cable C3, and the connection of the termination resistor 4 between the pair of conductors of the internal communication line 3 is kept valid.

Meanwhile, in the communication device D2, the contact member 23 of the second device-side connector 21B, which is a contact member intended for the internal communication line, and the contact member 33 of the second cable-side connector 31B, which is a contact member intended for the external communication line, are connected to each other. In this manner, the internal communication line 3 of the communication device D2 is connected to the internal communication line 3 of the communication device D3 via the external communication line 30 of the communication cable C3.

Also, the one contact member 23 of the second electrical contact point of the second device-side connector 21B and the other contact member 33 of the second cable-side connector 31B are connected to each other. As a result, the second electrical contact point of the electrical short-circuit path 8 is closed. Here, since the first electrical contact point of the electrical short-circuit path 8 is already closed, both ends of the photodiode serving as the voltage applying element in the control circuit 6 are short-circuited. Accordingly, the electric current stops flowing through the photodiode, and the photodiode stops emitting the light. In this manner, the pair of photo MOSFETs serving as the switching element 51 of the valid/invalid switching circuit 5 is turned off, and the connection of the termination resistor 4 between the pair of conductors of the internal communication line 3 is rendered invalid.

Therefore, the communication device D2 functions as a middle communication device in the daisy-chain connection. Meanwhile, in the communication device D3, the connector of the communication cable is not attached to the second device-side connector 21B, and the second electrical contact point of the electrical short-circuit path 8 is open. Accordingly, the connection of the termination resistor 4 between the pair of conductors of the internal communication line 3 is kept valid.

Therefore, the communication device D3 functions as a termination communication device in the daisy-chain connection.

Next, a description is given of a case in which, in a state where the second cable-side connector 31B of the communication cable 2 is attached to the device-side connector 21B of the communication device D1, the first cable-side connector 31A of the communication cable C2 (instead of the second cable-side connector 31B of the communication cable C3) is attached to the second device-side connector 21B (instead of the first device-side connector 21A) of the communication device D2.

In this case, since the first cable-side connector 31A of the communication cable C2 and the second cable-side connector 31B of the communication cable C3 have the same configuration as each other, similar to the above-described case where the first cable-side connector 31A of the communication cable C2 is connected to the first device-side connector 21A of the communication device D2, the internal communication line 3 of the communication device D2 is connected to the internal communication line 3 of the communication device D1 via the external communication line 30 of the communication cable C2. Although the second electrical contact point (23, 33) of the electrical short-circuit path 8 is closed, since the first electrical contact point is open, the connection of the termination resistor 4 between the pair of conductors of the internal communication line 3 is kept valid. Therefore, also in this case, the communication device D2 functions as a termination communication device in the daisy-chain connection.

The above descriptions of the communication devices D1 to D3 and the communication cables C2 and C3 are also applicable to the communication devices D1, D4, and D5 and the communication cables C1 and C4. When the second cable-side connector 31B of the communication cable C1 and the second cable-side connector 31B of the communication cable C2 are connected to the two second device-side connectors 21B of the communication device D1, respectively, the connection of each of the two termination resistors 4 between the pair of conductors of the internal communication line 3 is rendered invalid. Therefore, the communication system 100 functions as a communication system in which the communication devices D1 to D5 are daisy-chain connected by the communication cables C1 to C4, with the communication device D1 positioned at the center of the daisy-chain connection.

As described above, according to the communication system 100 of the present embodiment, each of the communication devices D2 to D5 is configured such that, when the first or second cable-side connector 31A or 31B of one of the communication cables C1 to C4 is connected to only one of the first and second device-side connectors 21A and 21B, the connection of the termination resistor 4 to the pair of conductors of the internal communication line 3 is valid. Accordingly, when the one of the communication cables C1 to C4 is connected to only one of the first and second device-side connectors 21A and 21B, regardless of whether it is connected to the first device-side connector 21A or the second device-side connector 21B, each of the communication devices D2 to D5 properly functions as a termination communication device in the daisy-chain connection. In addition, the number of termination resistors 4 that each of the communication devices D2 to D5 is required to include is just one.

Thus, the present embodiment makes it possible to provide the communication system 100, in which each of the communication devices D2 to D5 includes one termination resistor 4 for one internal communication line 3, and when one of the communication cables C1 to C4 is attached to only one of the pair of upstream-side and downstream-side connectors 21A and 21B in the daisy-chain connection, regardless of whether it is attached to the upstream-side connector 21A or the downstream-side connector 21 B, each of the communication devices D2 to D5 functions as a termination communication device in the daisy-chain connection, with the termination resistor 4 connected to the internal communication line 3.

Other Embodiments

The communication system 100 of the above first embodiment may be applied to SCSI (Small Computer System Interface).

From the foregoing description, numerous modifications and other embodiments of the present invention are obvious to a person skilled in the art. Therefore, the foregoing description should be interpreted only as an example and is provided for the purpose of teaching the best mode for carrying out the present invention to a person skilled in the art. The structural and/or functional details may be substantially altered without departing from the spirit of the present invention.

INDUSTRIAL APPLICABILITY

The communication system of the present invention is useful as a communication system in which a communication device includes one termination resistor for one communication line, and when a communication cable is attached to only one of a pair of upstream-side and downstream-side connectors of the communication device in daisy-chain connection, regardless of whether it is attached to the upstream-side connector or the downstream-side connector, the communication device functions as a termination communication device in the daisy-chain connection, with the termination resistor connected to the communication line.

REFERENCE SIGNS LIST 2 data processor
3 internal communication line
4 termination resistor
5 valid/invalid switching circuit
6 control circuit
7 voltage applying element
8 electrical short-circuit path
8a first portion
8b second portion
8c third portion
11 to 14 contactor
21A first device-side connector
21B second device-side connector
22 contact member
23 contact member
30 external communication line
31A first cable-side connector
31B second cable-side connector
32 contact member
33 contact member
41 to 44 contactor
100 communication system
101 casing
C1 to C4 communication cable
D1 to D5 communication device
R receiver
T transmitter
T1 to T5 communicator

The invention claimed is:
1. A communication system comprising:
a plurality of communication devices, each of the communication devices including:
an internal communication line configured to transmit signals by a pair of conductors;
a communicator connected to the internal communication line;
a common termination resistor connected between the pair of conductors of the internal communication line;
a valid/invalid switching circuit configured to render the connection of the common termination resistor to the pair of conductors of the internal communication line valid or invalid;
a first device-side connector including a communication line connection portion connected to one end of the internal communication line; and
a second device-side connector including a communication line connection portion connected to another end of the internal communication line; and
one or more communication cables, each of the communication cables including:
an external communication line configured to transmit signals by a pair of conductors;
a first cable-side connector including a communication line connection portion connected to one end of the external communication line; and
a second cable-side connector including a communication line connection portion connected to another end of the external communication line,
the first and second device-side connectors and the first and second cable-side connectors being configured such that:
when the first device-side connector and the first cable-side connector are connected to each other, the communication line connection portion of the first device-side connector and the communication line connection portion of the first cable-side connector are connected to each other; and
when the second device-side connector and the second cable-side connector are connected to each other, the communication line connection portion of the second device-side connector and the communication line connection portion of the second cable-side connector are connected to each other,
wherein the valid/invalid switching circuit is configured to:
in a case where the first and second cable-side connectors are connected to the first and second device-side connectors, respectively, render the connection of the common termination resistor to the pair of conductors of the internal communication line invalid; and
in other cases, render the connection of the termination resistor to the pair of conductors of the internal communication line valid.
2. A communication system comprising:
a plurality of communication devices, each of the communication devices including:
an internal communication configured to transmit signals by a pair of conductors;
a communicator connected to the internal communication line;
a termination resistor connected between the pair of conductors of the internal communication line;
a valid/invalid switching circuit configured to render the connection of the termination resistor to the pair of conductors of the internal communication line valid or invalid;
a first device-side connector including a communication line connection portion connected to one end of the internal communication line; and
a second device-side connector including a communication line connection portion connected to another end of the internal communication line; and
one or more communication cables, each of the communication cables including:
an external communication line configured to transmit signals by a pair of conductors;
a first cable-side connector including a communication line connection portion connected to one end of the external communication line; and
a second cable-side connector including a communication line connection portion connected to another end of the external communication line,
the first and second device-side connectors and the first and second cable-side connectors configured such that:
when the first device-side connector and the first cable-side connector are connected to each other, the communication line connection portion of the first device-side connector and the communication line connection onion of the first cable-side connector are connected to each other; and when the second device-side connector and the second cable-side connector are connected to each other, the communication line connection portion of the second device-side connector and the communication line connection onion of the second cable-side connector are connected to each other, wherein the valid/invalid switching circuit is configured to:
in a case where the first and second cable-side connectors are connected to the first and second device-side connectors, respectively, render the connection of the termination resistor to the pair of conductors of the internal communication line invalid; and
in other cases, render the connection of the termination resistor to the pair of conductors of the internal communication line valid, the valid/invalid switching circuit is configured to render the connection of the termination resistor to the pair of conductors of the internal communication line valid or invalid in accordance with a first control signal or a second control signal inputted to the valid/invalid switching circuit, each of the communication devices further includes a control circuit that includes a first electrical contact point and a second electrical contact point, the control circuit being configured to:
generate the first control signal when at least one of the first electrical contact point and the second electrical contact point is opened;
generate the second control signal when both the first electrical contact point and the second electrical contact point are closed; and
input the generated first control signal or second control signal to the valid/invalid switching circuit, the first device-side connector further includes one contact member of the first electrical contact point of the control circuit, the first cable-side connector further includes another contact member of the first electrical contact point of the control circuit, the second device-side connector further includes one contact member of the second electrical contact point of the control circuit, the second cable-side connector further includes another contact member of the second electrical contact point of the control circuit, and the first and second device-side connectors and the first and second cable-side connectors are configured such that:
when the first device-side connector and the first cable-side connector are connected to each other, the communication line connection portion of the first device-side connector and the communication line connection portion of the first cable-side connector are connected to each other, and the one contact member of the first electrical contact point of the first device-side connector and the other contact member of the first electrical contact point of the first cable-side connector come into contact with each other; and when the second device-side connector and the second cable-side connector are connected to each other, the communication line connection portion of the second device-side connector and the communication line connection portion of the second cable-side connector are connected to each other, and the one contact member of the second electrical contact point of the second device-side connector and the other contact member of the second electrical contact point of the second cable-side connector come into contact with each other.

3. The communication system according to claim 2, wherein
the valid/invalid switching circuit includes a switching element configured to:
become a conductive state when an ON voltage is applied to a control terminal of the switching element; and
become a non-conductive state when the ON voltage is not applied to the control terminal of the switching element, the termination resistor is connected to the pair of conductors via the switching element, the control circuit further includes:
a voltage applying element configured to apply the ON voltage to the switching element; and
an electrical short-circuit path configured to short-circuit both ends of the voltage applying element, the first electrical contact point and the second electrical contact point are inserted in series in the electrical short-circuit path, the first cable-side connector includes:
a first portion of the electrical short-circuit path; and
a pair of contactors constituting both ends of the first portion, respectively, the pair of contactors constituting the other contact member of the first electrical contact point, the first device-side connector includes a pair of contactors constituting a pair of ends, respectively, corresponding to both the ends of the first portion of the electrical short-circuit path, the pair of contactors constituting the one contact member of the first electrical contact point, the second cable-side connector includes:
a second portion of the electrical short-circuit path; and
a pair of contactors constituting both ends of the second portion, respectively, the pair of contactors constituting the other contact member of the second electrical contact point, the second device-side connector includes a pair of contactors constituting a pair of ends, respectively, corresponding to both the ends of the second portion of the electrical short-circuit path, the pair of contactors constituting the one contact member of the second electrical contact point, and when the first electrical contact point is closed as a result of the one contact member and the other contact member coming into contact with each other and the second electrical contact point is closed as a result of the one contact member and the other contact member coming into contact with each other, the electrical short-circuit path becomes a conductive state.

4. The communication system according to claim 1, wherein
in each communication device, a structure of the first device-side connector and a structure of the second device-side connector are the same, and in each communication cable, a structure of the first cable-side connector and a structure of the second cable-side connector are the same.

* * * * *